United States Patent [19]

Watanabe et al.

[11] Patent Number: 5,547,758
[45] Date of Patent: Aug. 20, 1996

[54] INSULATING MATERIAL

[75] Inventors: Chiharu Watanabe, Shibukawa; Tatsuo Nakano; Kazuo Kato, both of Machida, all of Japan

[73] Assignee: Denki Kagaku Kogyo Kabushiki Kaisha, Tokyo, Japan

[21] Appl. No.: 397,762

[22] Filed: Mar. 2, 1995

Related U.S. Application Data

[62] Division of Ser. No. 52,032, Apr. 20, 1993.

[30] Foreign Application Priority Data

Apr. 20, 1992 [JP] Japan .................................. 4-125459

[51] Int. Cl.$^6$ ............................. B32B 27/38; C08K 5/04; C07D 301/32
[52] U.S. Cl. ........................ 428/413; 428/416; 549/541; 549/542; 523/400; 523/440; 524/183; 524/186; 524/204; 524/399
[58] Field of Search ..................... 428/416, 413; 549/541, 542; 523/400, 440; 524/183, 186, 204, 399

[56] References Cited

U.S. PATENT DOCUMENTS

| | | | |
|---|---|---|---|
| 3,121,727 | 2/1964 | Baliker et al. | 549/542 |
| 3,413,320 | 11/1968 | Cofer | 549/541 |
| 3,764,622 | 10/1973 | Kuntschik et al. | 260/566 A |
| 3,862,057 | 1/1975 | Lindner | 523/400 |
| 4,017,523 | 4/1977 | Vargiu et al. | 549/541 |
| 4,026,761 | 5/1977 | Vargiu et al. | 159/49 |
| 4,132,718 | 1/1979 | Vargiu et al. | 549/517 |
| 4,535,150 | 8/1985 | Hunter | 549/542 |
| 4,831,101 | 5/1987 | Jellinek et al. | 549/541 |
| 5,096,762 | 3/1992 | Yoshida et al. | 523/440 |
| 5,151,486 | 9/1992 | Washio et al. | 528/124 |

FOREIGN PATENT DOCUMENTS

| | | |
|---|---|---|
| 60-4521 | 1/1985 | Japan . |
| 61-34016 | 2/1986 | Japan . |
| 62-174223 | 7/1987 | Japan . |
| 49920 | 3/1988 | Japan . |
| 2-286768 | 11/1990 | Japan . |

OTHER PUBLICATIONS

Lee et al "Handbook of Epoxy Resins" 1982 Reissue McGraw Hill pp. 6–32, 14–22, 17–27, 18–19.

*Primary Examiner*—John C. Bleutoe
*Assistant Examiner*—Randy Gulakowski
*Attorney, Agent, or Firm*—Oblon, Spivak, McClelland, Maier & Neustadt, P.C.

[57] ABSTRACT

An insulating material characterized by that said insulating material is made by curing a mixture composed of a bisphenol A type epoxy resin having purity which is equal to or more than 90% and an organic filler, the thermal conductivity thereof is in a range of $5.0 \times 10^{-3}$ to $18.0 \times 10^{-3}$ (cal/° C.·cm·sec) and the glass transition temperature thereof is in a range of 164° to 240° C.

12 Claims, 1 Drawing Sheet

FIGURE 1

INSULATING MATERIAL

This is a division of application Ser. No. 08/052,032 filed on Apr. 20, 1993, pending.

BACKGROUND OF THE INVENTION

1. Field of the Invention

The present invention relates to an insulating material employed in electronic instruments having excellent heat transfer property, and good insulating property and electrical reliability under an high temperature, and a circuit substrate and a module in use thereof.

2. Discussion of Background

A metal base circuit substrate has conventionally been employed for mounting electronic parts. The metal base circuit substrate is composed by adhering a conductive metal foil on the surface of a metal substrate interposing an adhesive insulating layer. The insulating layer is normally composed by filling an inorganic filler such as alumina to an epoxy resin. The thermal conductivity of the insulating layer is not larger than $5.0 \times 10^{-3}$ (cal/° C.·cm·sec). The glass transition temperature thereof is not larger than about 160° C., since the glass transition temperature is determined by an organic material such as an epoxy resin. Further, a metal base circuit substrate has been known wherein either one of the thermal conductivity and the glass transition temperature of the insulating layer exceeds the above numerical values. However, there has been no metal base circuit substrate having a property wherein both of the thermal conductivity and the glass transition temperature exceeds these values.

For instance, Japanese Unexamined Patent Publication No. 286768/1990 discloses a circuit substrate wherein an inorganic filler can densely be filled by filling the inorganic filler having a specified particle size to an epoxy resin, an insulative adhesive composition agent for a circuit substrate having a high thermal conductivity is provided and a conductive metal foil is laminated on a metal substrate interposing the insulative adhesive composition.

Further, Japanese Examined Patent Publication No. 49920/1988 discloses that a substrate for a hybrid integrated circuit can be provided which has a sufficient adhesive strength and a high thermal conductivity by interposing an adhesive agent wherein an epoxy resin includes aluminum oxide and a silane species coupling agent and/or a titanate species coupling agent between a metal substrate and a conductive metal foil.

However, although the thermal conductivity of the conventional adhesive composition is good and the adhesive strength thereof is promoted, it has a problem as an insulating material employed for electronic instruments having excellent heat resistance, especially the insulating property and electric reliability under a high temperature. Accordingly, a ceramic substrate such as an alumina substrate instead of a metal base circuit substrate has been employed when an especially good heat resistance is required.

In the conventional adhesive composition, a bisphenol A type epoxy resin has been employed as an epoxy resin. However, the viscosity thereof is comparatively high and the glass transition temperature is about 100° C. at most, since a bisphenol A type epoxy resin has normally been employed which is provided with the purity of approximately 80%.

In the mean time, the demands for "high-power" and high density mounting have more and more been increasing with respect to electric parts employed in an automobile, various industrial machines and instruments and electric appliances. In a power module mounted with elements such as these high-powered diode, transistors and integrated circuits, the heat transfer property sufficient for transferring the heat generated at the elements as well as high electric reliability under a high temperature environment are necessitated.

For instance, when a metal base circuit substrate is mounted with electronic parts, which is employed as a transistor module, a diode module or a solid state relay, the electric reliability under a high temperature as well as the sufficient heat transfer property are required since the temperature thereof is equal to or more than 125° C. and a high voltage of AC 300 V or more is applied thereon as an input voltage. Further, a high laminating strength of a copper foil under an elevated temperature is required for a power module which is employed in a place in the vicinity of an engine of an automobile (hereinafter, engine room), since heat is generated by the engine and the temperature of the power module becomes elevated, although the voltage thereof is comparatively low.

However, the glass transition temperature is low and the viscosity is comparatively high in the conventional bisphenol A type epoxy resin having a normal purity of about 80%. Accordingly, an insulating layer having a high thermal conductivity can not be formed since an inorganic filler material can not be filled in a large quantity and a filler material having a high thermal conductivity has not been employed. As stated above, there has been no insulating layer which satisfies simultaneously the thermal conductivity of $5.0 \times 10^{-3}$ (cal/° C.·cm·sec) or more and the glass transition temperature of 164° C. or more. Therefore, the conventional metal base circuit substrate can not be employed under these severe environments since the electric reliability thereof is poor. Further, in case of a ceramic substrate, a large substrate is difficult to be formed and the substrate is liable to cause cracks by impact or the like.

SUMMARY OF THE INVENTION

The present invention has been performed in view of the conventional technology and it is an object to provide an insulating material employed in electronic instruments having a high thermal conductivity and a high glass transition temperature, excellent in the heat transfer property and excellent in insulating performance and electric reliability under a high temperature by employing a bisphenol A type epoxy resin having a high purity which is refined to the purity of 90% or more by a molecular distillation of a conventional bisphenol A type epoxy resin which has conventionally been utilized.

Further, it is an object of the present invention to provide a circuit substrate and a module having the high insulating performance and electric reliability under a high temperature capable of mounting high-powered elements at a high density, which includes an insulating material having the high thermal conductivity as well as high glass transition temperature.

According to an aspect of the present invention, there is provided an insulating material characterized by that said insulating material is made by curing a mixture composed of a bisphenol A type epoxy resin having purity which is equal to or more than 90% and an inorganic filler, the thermal conductivity thereof is in a range of $5.0 \times 10^{-3}$ to $18.0 \times 10^{-3}$ (cal/° C.·cm·sec) and the glass transition temperature thereof is in a range of 164° to 240° C.

According to another aspect of the present invention, there is provided the insulating material according to the first aspect, wherein the mixture comprises 10 to 40 vol % of a bisphenol A type epoxy resin and 90 to 60 vol % of an inorganic filler.

According to another aspect of the present invention, there is provided a circuit substrate wherein a metal plate is laminated with a conductive foil interposing the insulating material according to the first aspect.

According to another aspect of the present invention, there is provided a module employing the circuit substrate according to the above aspect.

DETAILED DESCRIPTION OF THE PREFERRED EMBODIMENTS

A detailed explanation will be given of this invention as follows.

The insulating material of this invention is composed by thermosetting a mixture of a high purity bisphenol A type epoxy resin and an inorganic filler. The thermal conductivity of the curing body is in a range of 5.0 $10^{-3}$ to $18.0 \times 10^{-3}$ (cal/° C.·cm·sec) and the glass transition temperature is in a range of 164° to 240° C.

The high purity bisphenol A type epoxy resin employed in this invention is a high purity resin wherein the purity of the theoretical molecular structure of the glycidyl ether is refined to 90% or more, preferably 95% or more and further preferably 98% or more by a molecular distillation of a liquid bisphenol A type epoxy resin having the normal purity of about 80%, whereby impurity such as organic chlorine or $\alpha$-glycol are reduced.

The viscosity of the high purity bisphenol A type epoxy resin is low compared with that of the conventional bisphenol A type epoxy resin, for instance, as low as 10,000 cps (25° C.) or less and preferably 5,000 cps (25° C.) or less. Therefore, it is possible to fill a large quantity of an inorganic filler to the resin. The viscosity is a value measured by a B-type viscometer.

The glass transition temperature of curing body of the high purity bisphenol A type epoxy resin is in a range of 164° to 240° C., preferably 170° to 240° C.

Various ceramics, inorganic powders and glass fibers are employed for the inorganic filler of this invention.

As the ceramics or the inorganic powders, for instance, those of alumina, beryllia, boron nitride, magnesia, silica, silicone nitride, aluminum nitride or sintered bodies of these are employed. Especially, at least one selected from the group consisting of alumina, aluminum nitride and boron nitride is preferably employed. Furthermore, the inorganic filler is preferably composed of 60 to 80 vol % of particles having a mean particle size of 5 to 50 μm and 40 to 20 vol % of particles having the mean particle size of 0.2 to 1.5 μm (total 100 vol %). Furthermore, an inorganic filler is preferable which is composed of 60 to 80 vol % of particles having the mean particle size of 12 to 20 μm and 40 to 20 vol % of particles having the mean particle size of 0.6 to 0.8 μm.

The composition for an insulating material of this invention is provided by mixing 10 to 40 vol %, preferably 10 to 30 vol % of the bisphenol A type epoxy resin having the purity of 90% or more, with 90 to 60 vol %, preferably 90 to 70 vol % of the inorganic filler. When the percentage of the inorganic filler is under 60 vol %, an insulating material having a desired thermal conductivity can not be provided. When the percentage exceeds 90 vol %, the mixture can not become paste-like and can not be coated on a substrate.

A silane species coupling agent, a titanate species coupling agent, a stabilizer, a curing accelerating agent and the like can be employed to the composition for an insulating material of this invention according to the necessity.

The insulating material of this invention is made by curing a composition comprising the high purity bisphenol A type epoxy resin and the inorganic filler. The thermal conductivity of the curing body is in a range of $5.0 \times 10^{-3}$ to $18.0 \times 10^{-3}$ (cal/° C.·cm·sec), preferably $8.0 \times 10^{-3}$ to $18.0 \times 10^{-3}$ (cal/° C.·cm·sec) and the glass transition temperature is in a range of 164° to 240° C. preferably 170° to 240° C.

When the thermal conductivity of the curing body is not larger than $5.0 \times 10^{-3}$ (cal/° C.·cm·sec), a substrate is not provided which has a heat transfer performance sufficient for transferring heat generated by elements. Further, when the thermal conductivity of curing body exceeds $18.0 \times 10^{-3}$ (cal/° C.·cm·sec), although it is preferable that the thermal conductivity increases, the addition quantity of the inorganic filler should be increased. Accordingly, it becomes impossible to coat the composition for insulating material on the substrate since the composition does not become paste-like.

Further, when the glass transition temperature of the curing body is not larger than 160° C., there is a problem with respect to the electrical property under a high temperature. When the glass transition temperature of the curing body exceeds 240° C., a warp of the substrate is enlarged by the shrinkage of curing.

For curing the composition for insulating material, the composition is added with an amine species curing agent, for instance, diaminodiphenylmethane, thereby curing the composition.

Next, an explanation will be given of a circuit substrate and a module of this invention by a drawing.

Figure 1:
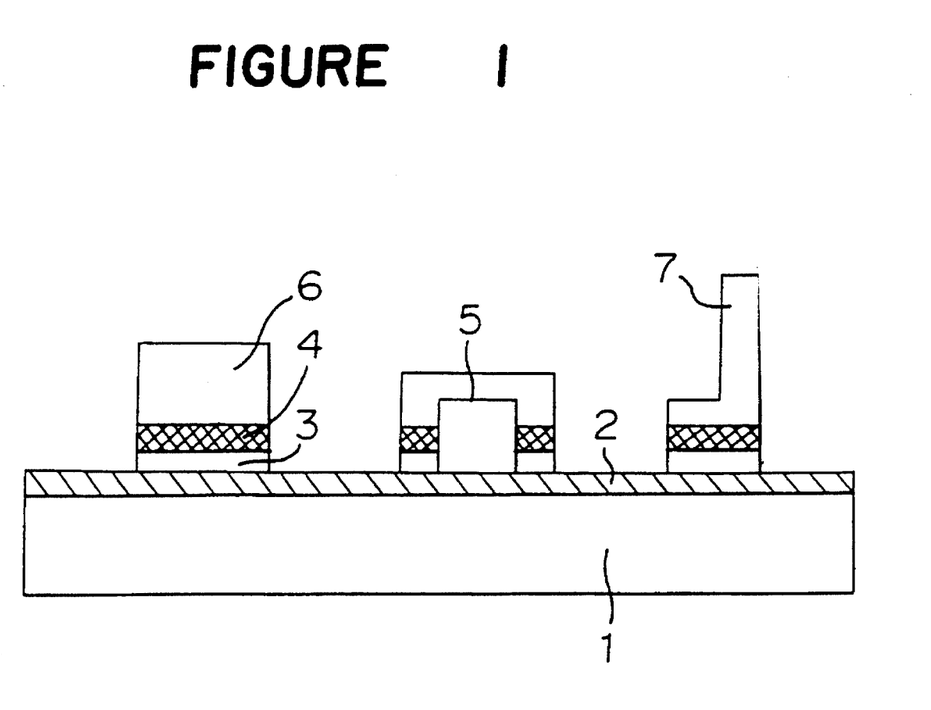
FIG. 1 is a cross section of a high power module wherein electronic parts are mounted on a circuit substrate of this invention.

FIG. 1 is a cross section showing an example of a high power module wherein a metal base circuit substrate of this invention is formed with a conductor circuit and mounted with various chip parts and the like. In FIG. 1, an insulating layer 2 composed of insulating material is formed on a base metal plate 1. A conductive foil 3 composed of a copper foil or a composite foil is laminated on the insulating layer. A conductor circuit is formed by etching. Various element parts, or a ceramic chip part 5, a semiconductor element 6, a terminal 7 and the like are mounted on the conductor circuit by joining them by a solder 4.

As a base metal substrate 1 employed in this invention, a plate of aluminum, aluminum alloy, copper, iron, stainless steel species alloy, invar species multi-layered metal and the like having the thickness of 0.5 to 3.0 mm, are generally employed.

Furthermore, as the material of the insulating layer 2, an insulating material formed by curing a composition for the insulating material comprising the high purity bisphenol A type epoxy resin and an inorganic filler.

When the insulating layer is formed by compounding the high purity bisphenol A type epoxy resin and the inorganic filler, the inorganic filler can be compounded in a large amount by employing a bisphenol A type epoxy resin which has not been found and wherein the content of dimer, trimer and oligomer is small, the monomer content is high, the glass transition temperature is high and the viscosity is low.

Therefore, it is possible to form the insulating layer having a high thermal conductivity and a high glass transition temperature.

In this way, the insulating layer can be formed which is provided with both the high thermal conductivity of $5.0 \times 10^{-3}$ to $18.0 \times 10^{-3}$ (cal/° C.·cm·sec) and the high glass transition temperature of 164° to 240° C. The measuring method of the thermal conductivity and the measuring method of the glass transition temperature are shown in Examples.

The circuit substrate employing the invented insulating material is employed in a transistor module, a diode module or a solid state relay. Further, a power module in an engine room of an automobile can be made by employing the circuit substrate.

Even when the transistor module, the diode module, the solid state relay, or the high power module employed in an engine room of an automobile, is employed under a severe condition of usage, the module is preferably provided with the insulating layer having the thermal conductivity of $8.0 \times 10^{-3}$ to $15.0 \times 10^{-3}$ (cal/° C.·cm·sec) and the glass transition temperature of 170° to 240° C.

The thickness of the formed insulating layer is normally in a range of 20 μm to 500 μm.

The thickness of a laminated foil made of aluminum and copper capable of being employed as a joint portion for a copper foil or a composite foil for the conductor circuit which is formed on the insulating layer, or for wire bonding, is in a range of 5 μm to 1 mm. The joint foil is etched and a desired circuit is formed. The high power module is made by mounting the ceramic chip part 5 such as a resistor or a condenser, and/or the semiconductor element 6 such as a diode, a thyristor or a transistor, and the terminal 7.

A specific explanation will be given of the present invention by Examples as follows.

EXAMPLE 1

A mixture provided by mixing 80 vol % of alumina powders (particles having the mean particle size of 16 μm/particles having the mean particles size of 0.7 μm=7/3 in volumetric ratio) and 20 vol % of a high purity bisphenol A type epoxy resin (monomer purity; 98%, viscosity; 4,500 cps at 25° C.) was added with the diaminodiphenylmethane as a curing agent, coated on an aluminum plate having the thickness of 1.5 mm by the thickness of 100 μm, heated into a semi-curing state, and laminated with an electrolytic copper foil having the thickness of 35 μm thereon by heating it and a copper circuit was formed thereon by etching. Next, after the copper circuit was mounted with a diode chip part for a diode module, a load was applied thereon and the temperature elevation at the chip portion when electric power of 50 W was dissipated, was measured.

As a result, the chip temperature was elevated only by 45° C. Further, a DC voltage of 1,200 V (plus pole on the side of pattern) was applied to the insulating layer at 150° C. continuously for 1,000 hours, with respect to 10 pieces of products made as above. However, the dielectric breakdown was not caused. When the voltage application continued further, a half of products were broken down after a duration of 3,890 hours. This revealed that the insulating material could be employed for the high power module. Further, when this substrate of 20×20 cm was dropped on a flat plate of oak from the height of 100 cm, no crack generation was recognized on the insulating layer.

The thermal conductivity of the curing body of the insulating material measured by the following method was $14.0 \times 10^{-3}$ (cal/° C.·cm·sec) and the glass transition temperature was 175° C.

(The method of measuring thermal conductivity)

A round test piece of thickness of 2 mm×diameter of 10 mm was employed and the thermal conductivity thereof was measured by a laser flash method thermal conductivity measuring device ("LF/TCM-FA-8510B" made by Rigakudenki Kogyo K.K.) with an ATT range of 20 μV, a sampling rate of 1,000 microseconds and a filter of 100 Hz.

(A measuring method of glass transition temperature; by Viblon method)

A test curing piece of 9×50×0.45 mm was employed and the glass transition temperature was measured from its peak value by the Viblon method by "RHEOVIBRON DOV-111-EP" made by Toyo Boldwin Co.

EXAMPLES 2 TO 5

A copper circuit was formed by a similar method as in Example 1 by employing alumina powders (the same as in Example 1) and a high purity bisphenol A type epoxy resin shown in Table 1.

Next, Table 1 shows a result of measuring the temperature elevation of a chip portion when a diode chip part for a diode module is mounted thereon, a load is applied thereon and 50 W of electric power is dissipated as in Example 1.

A DC voltage of 1,200 V (plus pole on the side of the pattern) was applied on the insulating layer at 150° C. continuously for 1,000 hours with respect to ten pieces of products made as above. However, no dielectric breakdown was caused on any of the Examples. Table 1 shows time intervals wherein the half of the products underwent the dielectric breakdown by continuing further the voltage application. It was revealed from the result of Table 1 that the invented insulating layer can be employed in a large power module in any Examples.

Table 1 shows the result of measuring the thermal conductivity and the glass transition temperature of the curing body of the insulating material as in Example 1. Substrates of 20×20 cm provided by Examples 2 to 5 were dropped on a flat plate of oak from the height of 100 cm. However, no crack was recognized on the insulating layers.

TABLE 1

| | Example 1 | Example 2 | Example 3 | Example 4 | Example 5 |
|---|---|---|---|---|---|
| Composition | | | | | |
| Bisphenol A vol % | 20 | 32 | 17 | 25 | 14 |
| (purity %) | (98.0) | (98.5) | (99.0) | (99.0) | (99.5) |
| [viscosity cps 25° C.] | [4500] | [4000] | [3700] | [3700] | [3500] |

TABLE 1-continued

|  | Example 1 | Example 2 | Example 3 | Example 4 | Example 5 |
|---|---|---|---|---|---|
| Alumina vol % | 80 | 68 | 83 | 75 | 86 |
| Silane coupling agent (weight part) | — | — | — | — | 1 |
| Curing agent | DDM | DDM | DDM | DDM | DDM |
| Physical property | | | | | |
| Thermal conductivity (Cal/°C · cm · sec) | $14 \times 10^{-3}$ | $7 \times 10^{-3}$ | $16 \times 10^{-3}$ | $10 \times 10^{-3}$ | $17.5 \times 10^{-3}$ |
| Glass transition temp. (°C.) | 175 | 200 | 215 | 220 | 230 |
| 50 W elevation temp. (°C.) | 45 | 55 | 38 | 50 | 35 |
| Dielectric breakdown time by voltage application (hour) | 3890 | 4500 | 2100 | 4100 | 2000 |

In Table 1:

(1) Bisphenol A designates a bisphenol A type epoxy resin.

(2) DDM designates diaminodiphenylmethane.

(3) 50 W elevation temperature designates temperature elevation of a chip portion when a load was applied on a sample mounted with a chip part and 50 W of electric power was dissipated.

(4) Dielectric breakdown time by voltage application designates a time interval wherein a half of ten pieces of products were broken down when a DC voltage of 1,200 V (plus pole on the side of pattern) was applied on an insulating layer at 150° C. continuously for 1,000 hours with respect to the ten pieces of the products and thereafter the voltage application continued further.

(5) The addition of silane coupling agent is shown by weight parts with respect to a total of 100 weight part of alumina plus resin.

(6) The viscosity is a value measured by the B type viscometer.

EXAMPLE 6

A copper circuit was formed by the similar method as in Example 1 employing 60 vol % of boron nitride powders (mean particles size of 3 μm) in place of the alumina powders in Example 1 and 40 vol % of a high purity bisphenol A type epoxy resin (monomer purity; 99.5%, viscosity; 3,500 cps at 25° C.).

Table 2 shows a result of the temperature elevation at a chip portion when a diode chip part for a diode module was mounted thereon, a load was applied thereon and 50 W of electric power was dissipated as in Example 1. A DC voltage of 1,200 V (Plus pole on the side of pattern) was applied on the insulating layer at 150° C. continuously for 1,000 hours with respect to ten pieces of products made as above. However, no dielectric breakdown occurred. Table 2 also shows time periods wherein a half of the ten pieces of the products underwent the dielectric breakdown by continuing the voltage application. It was found that the invented insulating layer could be employed for a high power module from the result of Table 2.

Table 2 also shows the result of measuring the thermal conductivity and the glass transition temperature of a curing body of the insulating material as in Example 1.

A substrate of 20×20 cm provided by Example 6 was dropped on a flat plate of oak from the height of 100 cm. However, no crack was recognized on the insulating layer.

EXAMPLE 7

A copper circuit was formed by the similar method as in Example 1 employing 68 vol % of aluminum nitride powders (mean particle size of 5 μm) in place of the alumina powders in Example 1 and a high purity bisphenol A type epoxy resin (monomer purity; 98.5%, glass transition temperature; 200° C., viscosity; 4,000 cps at 25° C.). Table 2 shows a result of temperature elevation of a chip portion when a diode chip part for a diode module was mounted on the copper circuit, a load was applied thereon and 50 W of electric power was dissipated as in Example 1.

A DC voltage of 1,200 V (plus pole on the side of pattern) was applied on the insulating layer at 150° C. continuously for 1,000 hours with respect to ten pieces of products made as above. However, no dielectric breakdown was caused. Table 2 also shows time periods wherein a half of the ten pieces of products were broken down by continuing the voltage application further. It was found that the invented insulating layer can be employed for a high power module from the result of Table 2.

Table 2 also shows the result of measuring the thermal conductivity and the glass transition temperature of a thermoset body of the insulating material as in Example 1.

Further, a substrate of 20×20 cm provided by Examples 7 was dropped on a flat plate of oak from the height of 100 cm. However, no crack was observed on the insulating layer.

TABLE 2

|  | Example 6 | Example 7 |
|---|---|---|
| Composition | | |
| Bisphenol A vol % | 40 | 32 |
| (purity %) | (99.5) | (98.5) |
| [viscosity cps 25° C.) | [3500] | [4000] |
| BN vol % | 60 | — |
| AlN vol % | — | 68 |
| Curing agent | DDM | DDM |
| Physical property | | |
| Thermal conductivity (Cal/°C. · cm · sec) | $6 \times 10^{-3}$ | $9 \times 10^{-3}$ |
| Glass transition temp. (°C.) | 230 | 200 |
| 50 W elevation temp. (°C.) | 60 | 50 |
| Dielectric breakdown time by voltage application (hour) | 5000 | 4000 |

EXAMPLE 8

After the metal base circuit substrates employed in Examples 1 through 7 were mounted with semiconductor elements, resistors, condensers and outside terminal leads, the metal base circuit substrates were accommodated in a high temperature vessel of which temperature was maintained at 150° C. The terminals were not exfoliated from the insulating layer after six months had elapsed. It was recognized that the assemblies were capable of being utilized as devices for rectifiers in an engine room of an automobile by the result of the experiment.

Comparative Example 1

A copper circuit is formed by the similar method as in Example 1 employing alumina powders (the same as in Example 1) and a normal bisphenol A type epoxy resin (monomer purity; 78%, viscosity; 12,000 cps at 25° C.) as shown in Table 3. Since the viscosity of the mixture of alumina powders 3, and the resin is high, the coating thereof can not be performed easily. Next, the temperature elevation of a chip portion was measured when the copper circuit was mounted with a diode chip part for a diode module, a load was applied thereon and 50 W of electric power was dissipated.

As a result, the chip temperature was elevated by 45° C. A DC voltage of 1,200 V (plus pole on the side of pattern) was continuously applied on the insulating layer at 150° C. with respect to ten pieces of products made as above. As a result, the dielectric breakdown was caused after 200 hours. It was recognized that the chip could not be employed for a high power module from the result of the experiment.

The thermal conductivity and the glass transition temperature of a curing body of the insulating material were measured as in Example 1. The results were shown in Table 3.

COMPARATIVE EXAMPLE 2

A copper circuit was formed by the similar method as in Example 1 employing alumina powders (same as in Example 1) and a normal bisphenol A type epoxy resin as shown in Table 3. Next, the temperature elevation of a chip portion was measured when the copper circuit was mounted with a transistor chip part for a transistor module, a load was applied thereon and 50 W of electric power was dissipated.

As a result, the chip temperature was elevated by 60° C. A DC voltage of 1,200 V (plus pole on the side of pattern) was continuously applied on the insulating layer at 150° C. with respect to ten pieces of products made as above. As a result, the dielectric breakdown was caused after 90 hours. It was recognized that the chip could not be employed for a high power module from the result of the experiment.

The thermal conductivity and the glass transition temperature of a curing body of the insulating material were measured as in Example 1. The results were shown in Table 3.

TABLE 3

|  | Comparative Example 1 | Comparative Example 2 |
|---|---|---|
| Composition |  |  |
| Bisphenol A vol % | 20 | 47 |
| (purity %) | (78.0) | (78.0) |
| [viscosity cps 25° C.] | [1200] | [12000] |
| Alumina vol % | 80 | 53 |
| Curing agent | DDM | DDM |
| Physical property |  |  |
| Thermal conductivity (Cal/°C. · cm · sec) | $14 \times 10^{-3}$ | $3 \times 10^{-3}$ |
| Glass transition temp. (°C.) | 90 | 90 |
| 50 W elevation temp. (°C.) | 45 | 60 |
| Dielectric breakdown time by voltage application (hour) | 200 | 90 |

COMPARATIVE EXAMPLE 3

A mixture of 59 vol % of alumina powders (particles having the mean particle size of 16 μm/particles having the mean particle size of 0.7 μm=7/3 in volumetric ratio) and 41 vol % of a bisphenol F type epoxy resin (monomer content; 78%, viscosity; 3,800 cps at 25° C.), was added with diaminodiphenylmethane as a curing agent, coated on an aluminum plate having the thickness of 1.5 mm by the thickness of 100 μm, heated into a semi-curing state, and laminated with an electrolytic copper foil having the thickness of 35 μm thereon which was cured thereon by heating it and a copper circuit is formed by etching. Next, after the copper circuit was mounted with a transistor chip part for a transistor module, the temperature elevation of a chip portion was measured when a load was applied thereon and 50 W of electric power was dissipated.

As a result, the temperature of the chip portion was elevated by 55° C. Further, a DC voltage of 1,200 V (plus pole on the side of pattern) was continuously applied on the insulating layer at 150° C., with respect to ten pieces of products made as above. As a result, the dielectric breakdown was caused after 100 hours. It was recognized that the chip could not be employed in a high power module from the result of experiment.

The thermal conductivity of a curing body of the insulating material was $4.0 \times 10^{-3}$ (Cal/° C.·cm·sec) and the glass transition temperature thereof was 100° C.

COMPARATIVE EXAMPLE 4

The metal base circuit substrates employed in Comparative Examples 1 to 3 were mounted with semiconductor elements, resistors, condensers and outside terminal leads, and accommodated in a high temperature vessel of which temperature was maintained at 150° C. As a result, the terminal was exfoliated from the insulating layer after six months. It was recognized that the assemblies were not capable of being utilized as devices for a rectifier in an engine room of an automobile.

REFERENCE EXAMPLE 1

A conductive paste was coated and cured on an alumina ceramics substrate having the thickness of 0.635 mm and mounted with transistor chip parts. The substrate of 10×10 cm was dropped on a substrate of oak from the height of 100 cm. As a result, the substrate was destroyed and could not be used.

As explained above, an insulating material employed in electronic instruments can be provided which has a high thermal conductivity and a high glass transition temperature, excellent in the heat transfer performance and excellent in insulating performance and electrical reliability under an elevated temperature, by employing the high purity bisphenol A type epoxy resin.

Further, the present invention can provide a circuit substrate having the insulating material provided with both the high thermal conductivity and the high glass transition temperature, capable of mounting high-powered elements at a high density, and which has high insulating performance and electric reliability under an elevated temperature.

Further, the circuit substrate of this invention can mount high-powered heat generating elements and can provide diodes, transistors, and solid state relays having a long period of service life of voltage resistance under an elevated temperature. This invention can provide a power module which can be employed under a severe environment in an engine room of an automobile.

What is claimed is:

1. An insulating material characterized by that said insulating material is made by curing a mixture comprising from 10 to 40 vol % of a bisphenol A epoxy resin purified by molecular distillation, having a purity which is equal to or more than 98% free of organic chlorine and d-glycol impurities and dimer, trimer and oligomers, and from 90 to 60 vol % of an inorganic filler, the thermal conductivity thereof is in the range of $5.0\times10^{-3}$ to $18.0\times10^{-3}$ cal/° C.·cm·sec and the glass transition temperature thereof is in the range of 164° to 240° C.

2. The insulating material according to claim 1, wherein the inorganic filler comprises at least one selected from the group consisting of alumina, aluminum nitride and boron nitride.

3. The insulating material according to claim 1, wherein the inorganic filler comprises 60 to 80 vol % of first particles having a mean particle size of 5 to 50 μm and 40 to 20 vol % of second particles having a mean particle size of 0.2 to 1.5 μm, the total being 100 vol %.

4. The insulating material according to claim 1, wherein the amount of the inorganic filler is from 60 vol % to 78 vol %.

5. The insulating material according to claim 1, wherein the purity of the epoxy resin is 98.5% or higher.

6. The insulating material according to claim 1, wherein the thermal conductivity thereof is in the range of $5.0\times10^{-3}$ to $12.0\times10^{-3}$ cal/° C.·cm·sec.

7. The insulating material according to claim 1, wherein the glass transition temperature thereof is in the mange of 170° to 240° C.

8. The insulating material according to claim 1, wherein the glass transition temperature thereof is in the range of 190° to 240° C.

9. The insulating material according to claim 1, wherein the mixture includes at least one element selected from the group consisting of a silane species coupling agent and a titanate species coupling agent.

10. The insulating material according to claim 1, wherein the mixture includes at least an amine species curing agent.

11. The insulating material according to claim 10, wherein the amine species curing agent is diaminodiphenylmethane.

12. A method for preparing an insulating material, comprising curing a mixture comprising from 10 to 40 vol % of a hisphenol A epoxy resin purified by molecular distillation, having a purity which is equal to or more than 98% free of organic chlorine and α-glycol impurities and dimer, trimer and oligomers, and from 90 to 60 vol % of an inorganic filler.

* * * * *

UNITED STATES PATENT AND TRADEMARK OFFICE
CERTIFICATE OF CORRECTION

PATENT NO. : 5,547,758

DATED : August 20, 1996

INVENTOR(S) : Chiharu WATANABE et al

It is certified that error appears in the above-identified patent and that said Letters Patent is hereby corrected as shown below:

On the title page, in the Abstract, fifth line, "organic" should read --inorganic--;
seventh line, "C." should read --C--;
eighth line, "164°" should read --164°C--.

Column 1, line 23, "C." should read --C--;
line 62, "C." should read --C--.

Column 2, line 30, "C." should read --C--;
line 31, "C." should read --C--;
line 64, "C." should read --C--;
line 65, "164°" should read --164°C--.

Column 3, line 27, "C." should read --C--;
line 28, "164°" should read --164°C--;
line 40, "C." should read --C--;
line 46, "164°" should read --164°C--; "170°" should read --170°C--.

Column 4, line 14, "C." should read --C--;
line 15, "C." should read --C--;

UNITED STATES PATENT AND TRADEMARK OFFICE
CERTIFICATE OF CORRECTION

PATENT NO. : 5,547,758
DATED : August 20, 1996
INVENTOR(S) : Chiharu WATANABE et al It is certified that error appears in the above-identified patent and that said Letters Patent is hereby corrected as shown below:

```
            line 16,   "164°" should read --164°C--; "170°"
                       should read --170°C--;
            line 23,   "C." should read --C--;
            line 29,   "C." should read --C--;
            line 32,   "C." should read --C--.
Column 5,   line 6,    "C." should read --C--;
            line 7,    "164°" should read --164°C--;
            line 21,   "C." should read --C--;
            line 22,   "170°" should read --170°C--;
            line 44,   "C." should read --C--;
            line 56,   "C." should read --C--.
Column 6,   line 12,   "C." should read --C--;
            line 42,   "C." should read --C--.
Columns 5-6, in Table 1, last line,    "25°C.)" should read
                                       --25°C)--.
Columns 7-8, in Table 1, line 9, "(Cal/°C." should read
                       --(cal/°C--;
```

UNITED STATES PATENT AND TRADEMARK OFFICE
CERTIFICATE OF CORRECTION

PATENT NO. : 5,547,758

DATED : August 20, 1996

INVENTOR(S) : Chiharu WATANABE et al

It is certified that error appears in the above-identified patent and that said Letters Patent is hereby corrected as shown below:

line 10, "(°C.)" should read --(°C);

line 11, "(°C.)" should read --(°C)--.

Column 7, line 29, "150°C." should read --150°C--;

line 44, "C." should read --C--;

line 50, "C." should read --C--.

Column 8, line 20, "C." should read --C-- (both occurrences);

line 26, "C." should read --C--.

In Table 2, line 6, "25°C." should read --25°C--;

line 12, "(Cal/°C." should read --(cal/°C)--;

line 13, "°C." should read --°C--;

line 14, "°C." should read --°C--.

Column 9, line 3, "Comparative Example" should read --COMPARATIVE EXAMPLE--.

line 9, "C." should read --C--;

UNITED STATES PATENT AND TRADEMARK OFFICE
CERTIFICATE OF CORRECTION

PATENT NO. : 5,547,758

DATED : August 20, 1996

INVENTOR(S) : Chiharu WATANABE et al

It is certified that error appears in the above-identified patent and that said Letters Patent is hereby corrected as shown below:

line 11, "3," should read --3--.
      line 19, "C." should read --C--;
      line 40, "C." should read --C--.
In Table 3, line 7, "C." should read --C--; "1200" should
              read --12000--,
      line 12,    "(Cal/°C." should read --(cal/°C)--;
      line 13,    "°C." should read --°C--;
      line 14,    "°C." should read --°C--.
Column 10, line 6, "C." should read --C--;
      line 21, "C." should read --C--;
      line 27, "(Cal/°C." should read --(cal/°C--.
Column 11, line 8, "d-glycol" should read --α-glycol--;
      line 11, "C." should read --C--;
      line 12, "164°." should read --164°C--.
Column 12, line 3, "C." should read --C--;
      line 5, "mange" should read --range--;
      line 6, "170°" should read --170°C--;

UNITED STATES PATENT AND TRADEMARK OFFICE
CERTIFICATE OF CORRECTION

PATENT NO. : 5,547,758
DATED : August 20, 1996
INVENTOR(S) : Chiharu WATANABE et al It is certified that error appears in the above-identified patent and that said Letters Patent is hereby corrected as shown below:

```
            line 9,   "190°"     should read --190°C--;
Column ,    line 22,  "hisphenol" should read --bisphenol--.
```

Signed and Sealed this

Eighth Day of April, 1997

Attest:

BRUCE LEHMAN

Attesting Officer    Commissioner of Patents and Trademarks